United States Patent [19]
Maertens et al.

[11] Patent Number: 5,767,799
[45] Date of Patent: Jun. 16, 1998

[54] LOW POWER HIGH SPEED MPEG VIDEO VARIABLE LENGTH DECODER

[75] Inventors: James N. Maertens, Sunnyvale, Calif.; Kyung In Han, Somerville, Mass.

[73] Assignee: Mitsubishi Semiconductor America, Inc., Durham, N.C.

[21] Appl. No.: 567,592

[22] Filed: Dec. 5, 1995

[51] Int. Cl.⁶ .................................................. H03M 7/40
[52] U.S. Cl. .................................................. 341/67; 386/109
[58] Field of Search .............................. 341/67, 59, 65, 341/79; 386/109

[56] References Cited

U.S. PATENT DOCUMENTS

| | | |
|---|---|---|
| 5,146,325 | 9/1992 | Ng . |
| 5,173,695 | 12/1992 | Sun et al. . |
| 5,220,325 | 6/1993 | Ackland et al. . |
| 5,220,410 | 6/1993 | Wakeland et al. . |
| 5,225,832 | 7/1993 | Wang et al. . |
| 5,233,348 | 8/1993 | Pollmann et al. . |
| 5,245,338 | 9/1993 | Sun . |
| 5,253,053 | 10/1993 | Chu et al. . |
| 5,280,349 | 1/1994 | Wang et al. . |
| 5,305,113 | 4/1994 | Iwamura et al. . |
| 5,309,156 | 5/1994 | Fujiyama . |
| 5,325,092 | 6/1994 | Allen et al. . |
| 5,657,416 | 8/1997 | Boon .................................. 386/109 |

FOREIGN PATENT DOCUMENTS

4177916   6/1992   Japan .

*Primary Examiner*—Brian K. Young
*Attorney, Agent, or Firm*—McDermott, Will & Emery

[57] ABSTRACT

A variable length decoder comprises a bitstream feeder connected to a header analyzer, and a block data decoder coupled to the feeder. The bitstream feeder includes a barrel shifter to output a 32-bit bitstream to the header analyzer, block data decoder and control circuit. The header analyzer detects the start codes of the MPEG header layers and decodes the parameters of the MPEG layers contained in the encoded bitstream. Further, the header analyzer decodes the quantization factors of 8×8 pixel data which have been converted into 64 DCT coefficients. The block data decoder includes a macroblock decoder connected to a block decoder. The macroblock decoder outputs a header_start signal, and activates the block decoder. The block decoder includes a code table for decoding 64 coefficients in each of the 6 block layers based on a binary pattern of a predetermined number of bits of the bitstream. The six block layers are decoded within 384 clock cycles. The control circuit monitors the functions of the bitstream feeder, the header analyzer and the block data decoder.

33 Claims, 9 Drawing Sheets

(PRIOR ART)

RUN LENGTH DECODER

EXAMPLE CODE TABLE

| BITSTREAM | NUM BITS | VALUE | ZERO COUNT* |
|---|---|---|---|
| 0 1 | 2 | 2 | 1 |
| 0 0 1 | 3 | 3 | 3 |
| 0 0 0 0 1 | 5 | 3 | 4 |
| 0 0 0 1 0 | 5 | 1 | 3 |
| 0 0 0 1 1 | 5 | 1 | 4 |
| 0 0 0 0 0 1 | 6 | 4 | 0 |

\* ZERO COUNT MEANS THE NUMBER OF VALUES = 0 THAT SHOULD BE OUTPUT ON VIDEO PRIOR TO THE OUTPUT OF VALUE. SEE NEXT PAGE.

Figure 7C

EXAMPLE OF ZERO COUNT:
BITSTREAM = 0 0 1 0 0 0 1 1 0 1 0 1 0 0 0 0 0 1 0 1 ...

| | CLK | BITSTREAM | NUMBITS | VALUE | ZERO COUNT | SIZE | VIDEO |
|---|---|---|---|---|---|---|---|
| ENABLE | 1 | <u>001</u>00011010100000101 ... | 3 | 3 | 3 | 0 | 0 |
| | 2 | " | 3 | 3 | 3 | 0 | 0 |
| | 3 | " | 3 | 3 | 3 | 0 | 0 |
| | 4 | " | 3 | 3 | 3 | 3 | 3 |
| | 5 | <u>00011</u>010100000101 ... | 5 | 1 | 4 | 0 | 0 |
| | 6 | " | 5 | 1 | 4 | 0 | 0 |
| | 7 | " | 5 | 1 | 4 | 0 | 0 |
| | 8 | " | 5 | 1 | 4 | 0 | 0 |
| | 9 | " | 5 | 1 | 4 | 5 | 1 |
| | 10 | <u>01</u>0100000101 ... | 2 | 2 | 1 | 0 | 0 |
| | 11 | " | 2 | 2 | 1 | 2 | 2 |
| | 12 | <u>01</u>00000101 ... | 2 | 2 | 1 | 0 | 0 |
| | 13 | " | 2 | 2 | 1 | 2 | 2 |
| | 14 | <u>000001</u>01 ... | 6 | 4 | 0 | 6 | 4 |
| | 15 | <u>01</u> ... | 2 | 2 | 1 | 0 | 0 |
| | 16 | " | 2 | 2 | 1 | 2 | 2 |

Figure 7D

LOW POWER HIGH SPEED MPEG VIDEO VARIABLE LENGTH DECODER

TECHNICAL FIELD

The present invention relates to the recovery of compressed digital data, and more particularly, to device and method for decoding variable length encoded digital signals.

BACKGROUND ART

Digital transmission of television signals can deliver video and audio services of much higher quality than analog signals. Digital transmission schemes are particularly advantageous for signals that are broadcasted by satellite to cable television affiliates and/or directly to home satellite television receivers. It is expected that digital television transmitter and receiver systems will replace existing analog systems just as digital compact discs have largely replaced analog phonograph records in the audio industry.

A substantial amount of digital data must be transmitted in any digital television system. In a digital television system, a subscriber receives the digital data bitstream via a receiver/descrambler that provides the video and audio data to the subscriber. In order to most efficiently use the available radio frequency spectrum, the digital television signals are compressed to minimize the amount of data transmitted.

The video portion of a television signal comprises a sequence of video "frames" that together provide a moving picture. In digital display systems, each line of a video frame is defined by a sequence of digital data referred to as "pixels." A large amount of data is required to define each video frame of a television signal. For example, 7.4 megabits of data is required to provide one video frame at the National Television System Committee (NTSC) resolution. This assumes a 640 by 480 pixel line display is used with an 8-bit intensity value for each of the primary colors of red, green and blue. A high definition television requires substantially more data to provide each video frame. In order to manage this amount of data, particularly for HDTV applications, the data must be compressed.

Recently, demands for full motion video in such applications as video telephony, video conferencing, and/or multimedia applications have required that standards be introduced for motion video on computer systems. Such applications have required a development of compression techniques which can reproduce the amount of data required to represent a moving image along with the corresponding sound to manageable lengths which may be transmitted using current communications hardware.

Variable-length coding is a coding technique often used for lossless data compression. In accordance with this technique, an 8×8 pixel of the video data is converted into discrete cosine transform (DCT) coefficients. The DCT coefficients are then quantized by quantization factors. The quantized DCT coefficients are Huffman encoded to form Huffman codewords. Such an encoding of the video data contained in the bitstreams is commonly used to construct a minimum redundant variable-length code for a known data statistic. In general, the lengths of the codewords are chosen so that shorter codewords are used to represent the more frequently occurring video data and longer codewords are chosen to represent the less frequently occurring video data.

One standard using Huffman encoding for compression of motion picture video images for transmission or storage is known as the Motion Picture Experts Group (MPEG) standard. The MPEG standard is an international standard for the compression and communication of motion video pictures and audio. The MPEG standard allows full motion video images to be transmitted at rates of up to thirty frames per second (fps) or 60 fields per second. The MPEG standard allows motion picture video to be compressed along with the corresponding high quality sound and provides other features such as single frame advance, reverse motion, and still frame video.

The decoding and processing of the MPEG video bitstreams are critical to the performance of any MPEG decoding system. The compressed MPEG video bitstreams contain the various parameters needed in the reconstruction of the audio and video data. The MPEG bitstream can easily be divided into two bitstreams, audio and video.

There are currently two versions of the MPEG video standard which have been standardized, commonly referred to as the MPEG1 and MPEG2 standards. In general, the MPEG2 standard has a higher resolution than the MPEG1 and can handle more functions. The MPEG video bitstream consists of the video parameters, as well as the actual compressed video data.

Figure 1A:
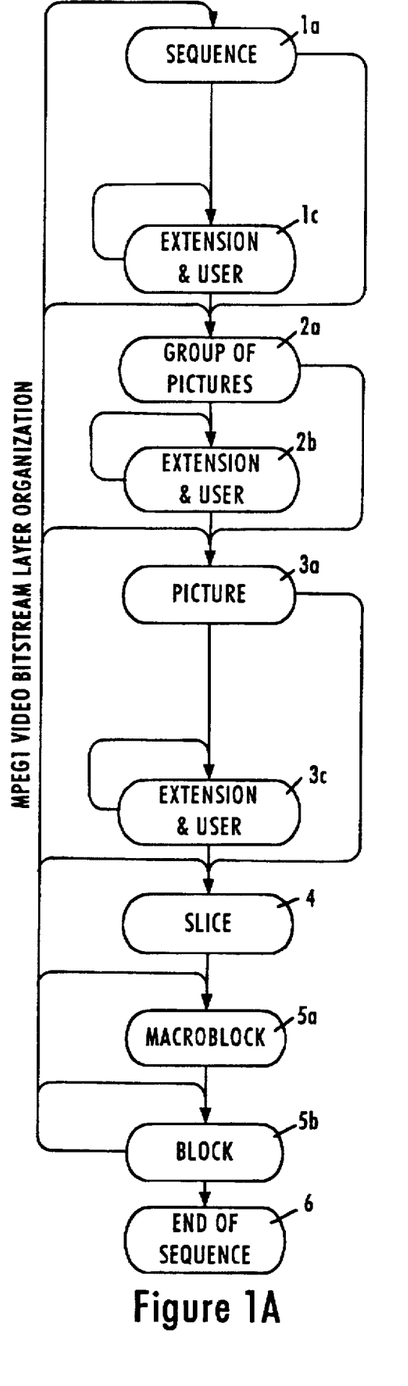
FIGS. 1A and 1B depicts a video bitstream layer organization of the MPEG1 and MPEG2.
Figure 1B:
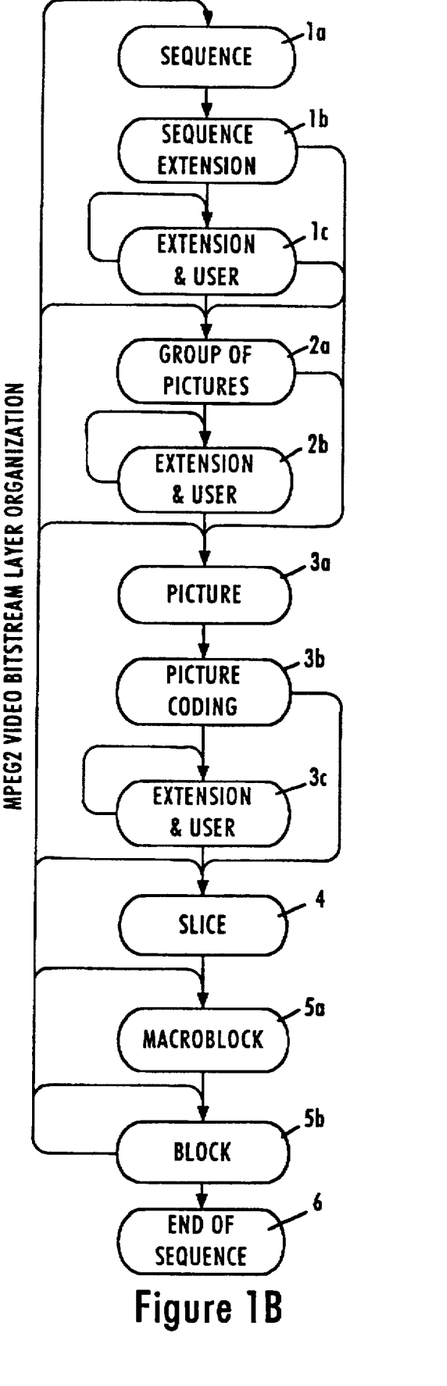

FIGS. 1A and 1B are an illustration of a video bitstream layer organization of the MPEG1 and MPEG2 standards. The MPEG1 standards comprise a sequence layer 1a, extension and user layers 1c, 2b and 3c, group of pictures layer 2a, a picture layer 3a, a slice layer 4, a macroblock layer 5a, a block layer 5b and an end of sequence layer 1b. Additionally, the MPEG2 standard includes a sequence extension layer 1b and a picture coding layer 3b. Such MPEG1 and MPEG2 layer organizations define the entire transmission of the video data.

The header layers of the sequence, sequence extension, group of pictures, etc, contain the parameters of the actual image. The macroblock layer 5a and block layer 5b contain the actual video data of the actual image. All the header layers prior to the macroblock layer 5a contain the preliminary information needed for the data of the block layer 5b. The sequence layer 1a defines the size of the picture that is being sent. For example, the picture size for a television (TV) is fixed, whereas in other applications, such as a computer, the picture size can vary. The sequence layer 1a does not have to be sent often and is sent only when an update of one of the sequence parameters, such as picture size, is required.

The sequence extension layer 1b is a later revision of the MPEG1 and allows more bits to be use to define larger size pictures. The number of bits in the MPEG1 allows a picture size only up to a certain limit. With the sequence extension layer 1b, the MPEG2 allows the size of higher resolution pictures, such as high definition television (HDTV), to be defined. For example, the sequence layer 1a of MPEG1 uses 12 bits to define the size of the picture, e.g., the horizontal size. In the U.S., the horizontal size is 720 pixels in digital television, but the horizontal size increases to 1440 pixels in HDTV. The sequence layer 1a of MPEG1 is insufficient to define such a size, and additional bits of the sequence extension layer 1b are used to define the picture size of the HDTV.

The extension and user layers 1c, 2b and 3c are used to include data for an entity's own applications. In other words, whoever encodes the data can place this extra user data in the video bitstream. Such data can be used, for example, to place special company insignia on the picture to be displayed. The extension and user layers 1c, 2b and 3c are not necessary and can be skipped, as shown by an arrow going from the sequence layer 1a to a group of pictures layer 2a.

The group of pictures layer 2a defines one or more pictures in a particular area. For example, the group of pictures layer 2a may define how many pictures there are through an entire movie or a video sequence. The group of pictures layer 2a also allows the breakdown of the video hierarchy. Since the group of pictures layer 2a is not necessary, MPEG2 allows this layer to be skipped over to the picture layer 3a which includes the data of an actual picture frame. Under the NTSC standard, there is a requirement for thirty picture frames per second. However, there is no upper limit as to the number of pictures per group of pictures.

The slice layer 4 allows the picture to be broken down into different areas or slices. There can be one slice of a picture constituting one entire picture, or multiple slices. For example, every macroblock, or 16×16 pixel area, or combination of macroblocks of the picture can comprise one slice. Such a breakdown of the picture facilitates a recovery of the picture when an error is detected.

If the picture is not broken down into slices and an error is detected, the error can destroy the entire picture since there is no way to recover from the error until the next picture is produced. By breaking down the picture into slices, error recovery can be accomplished when a subsequent slice of the picture is received. There may be only one bad area of the picture, but the entire picture is not lost. It is also easier to handle error concealment based upon a slice since there is a smaller area to conceal rather than the entire picture.

The macroblock and block layers 5a and 5b include the real data for the display screen. One macroblock layer 5a includes 6 sub-blocks of data. However, the data required for the display screen needs to be in various formats. For example, in a computer, an RGB (Red, Green, Blue) format is used to display the picture on the screen. In a TV, luminous, chromonous blue and chromonous red signals are required. The MPEG1 and MPEG2 standards use this data format to form the picture on the display screen. The luminous signal defines the brightness of a pixel, and the chromonous blue and red signals provide the color for the display screen. Four sub-blocks of data are assigned to the luminous signal. One sub-block is assigned to the chromonous red signal and one sub-block is assigned to the chromonous blue signal.

Further, each sub-block of data has information regarding an 8 by 8 pixel area on the screen. Hence, the macroblock layer 5a contains 64 coefficients of data for displaying the picture on the display screen. After the macroblock layer 5a is sent, the block layer 5b containing the video data for the picture on the screen is included in MPEG1 or MPEG2.

Further, the macroblock and block layers are different from the other layers because they do not have a start code. Within each layer, a start code is included to identify the data within the layers of MPEG1 or MPEG2. A detailed description of the start code can be found in a commonly assigned co-pending U.S. patent application Ser. No. 08/561,756 filed on Nov. 22, 1995 entitled "High Bit Rate Start Code Searching and Detecting Circuit, which is incorporated herein by reference." The macroblock and block layers cannot be easily detected within the data bitstreams of MPEG1 or MPEG2. Hence, the only way to know that the macroblock and block layers exist is that the macroblock layer comes directly after a slice layer, and then directly after macroblock layer comes the block layer.

The MPEG2 standard also includes a picture coding layer 3b. This layer is similar to the sequence extension layer 1b.

In MPEG2, there are various formats available for displaying the picture on the screen. These formats allow different portions of the picture to be displayed. For example, the picture frames of a movie displayed on television have the sides cut off, because the movie screen is comparatively much wider than the TV screen due to the differing aspect ratios. Using the picture coding layer 3b, the data to cut off the sides of the movie can be specified.

The initial step in decoding any MPEG encoded video bitstream is the extraction of parameters and video data. Some designs use an internal central processing unit, i.e., a CPU chip, to detect the sequence layer and sequence extension layer, etc. However, other designs utilize a circuit known as a Variable Length Decoder (VLD). The main function of the VLD is to parse the MPEG video bitstream and extract all parameter and video data. These parameters and video are subsequently provided to other circuits which can then reproduce the video picture frames.

For example, the highest level of any MPEG video bitstream is the sequence layer. Therefore, the VLD must search and detect a sequence layer in the bitstream before any video data can be decoded. The VLD must also be able to automatically detect whether the incoming bitstream is MPEG1 or MPEG2 by the presence or lack of the sequence extension layer. These tasks should be done as quickly as possible and with very high reliability. Further, because the VLD is only part of a video decoding system, the amount of power dissipation by the VLD is crucial to the performance of the whole system.

Figure 2:
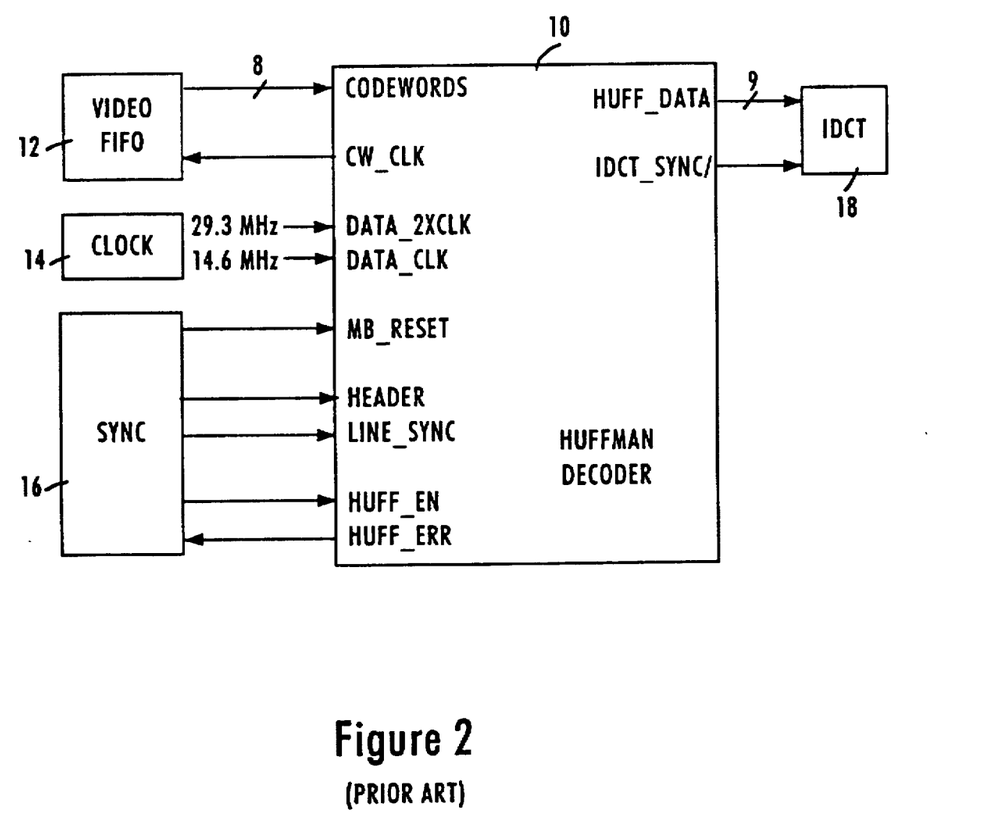
FIG. 2 shows a prior art variable length decoder (VLD)

U.S. Pat. No. 5,233,348 to Pollmann et al. discloses a prior art VLD known as a Huffman decoder, which is depicted in FIG. 2. The purpose of the Huffman decoder 10 is to translate variable length codewords received from an encoder into DCT coefficients for transformation into video data. The Huffman decoder 10 receives the bitstream of data from a video first-in-first-out (FIFO) register 12. The video FIFO register 12 outputs the bitstream to Huffman decoder 10 on an eight-bit codeword bus. The 14.6 MHz clock ("DA-TA CLK") and 29.3 MHz clock ("DATA_2×CLK") are synchronously outputted from a conventional clock circuit 14.

To ensure that any error made by the Huffman decoder does not propagate indefinitely, the decoder is reset by a synchronization circuit 16 for each macroblock layer. A macroblock reset signal ("MB_RESET") is provided by the synchronization circuitry during a horizontal blanking interval of the video signal being processed when the Huffman decoder is not enabled. When an error be detected in the Huffman decoder, a Huffman error detect signal ("HUFF_ERR") will be output to the synchronization circuitry 16. A line synchronization ("LINE_SYNC") is provided from the synchronization circuitry 16 to the Huffman decoder 10 and is used to inform the Huffman decoder 10 that a first bit is ready to be read.

Figure 3:
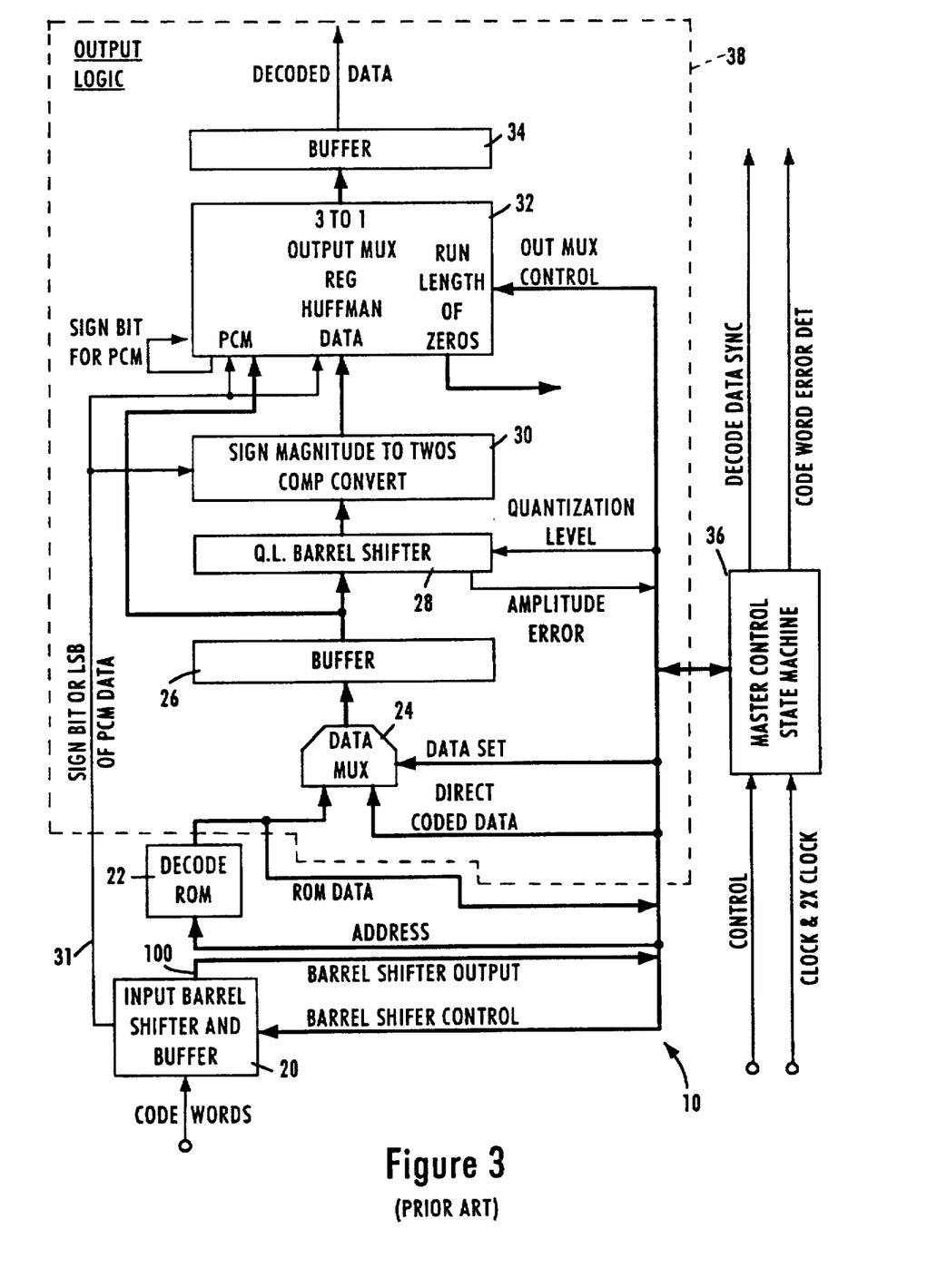
FIG. 3 is a detailed illustration of the VLD shown in FIG. 2.

FIG. 3 is a more detailed block diagram of the Huffman decoder 10. The Huffman decoder 10 receives the Huffman codewords that are to be decoded into video data from a video FIFO register 12 (e.g., VRAM or DRAM) . The codewords are inputted to an input barrel shifter and buffer 20 (FIG. 2). The function of the input barrel shifter is to bring in the variable length data from the video FIFO and feed it to an address port of a decoder ROM 22. The ROM contains all of the necessary information for codeword conversion.

The selection of data, depending on the current state and the data read from the ROM, is controlled by a master control state machine 36. For most codewords, data is latched from a data multiplexers 24 after the data has been decoded from the codeword provided by the input barrel shifter 20 in one clock cycle. During the time that a codeword is being decoded, data that was latched at the previous clock cycle is routed through an inverse quantization barrel shifter 28 which is used to renormalize the data to its equivalent magnitude before it was encoded. After the inverse normalization, the data is converted from sign magnitude to twos complement by a circuitry 30 and inputted to a 3 to 1 multiplexer 32 for output to a buffer 34.

The performance of the entire video decoding system is directly related to the performance of the Variable Length Decoder. Therefore, the design of the VLD is extremely important for the correct operation of the system. The VLD has to be able to parse very large video bitstreams in a short time in order to produce a video output of 30 full frames of video data per second with a low power dissipation.

Such high-speed requirements are particularly critical for the digital transmission of HDTV signals. In such an HDTV system, the total sample rate (combining luminance and chrominance signals) is likely to be 100 MHz. If variable-length coding is used, the maximum length codeword could typically be 16 bits. A bit-by-bit decoder would thus need to shift at 16 times the sample rate, or at 1.6 Gbits/sec, to detect the codewords at the sample rate.

The Huffman decoder and other designs for variable length are disadvantageous since they have high power consumption and/or a low input bit rate. Such designs are unacceptable for very high speed decoders. For example, these designs for the VLD often use two or more barrel shifters which require a large area and are slow in performance. Other designs use built-in memory structures, which also tend to be slow in performance. These existing designs require 768 or 1152 clock cycles to decode a macroblock, which causes performance problems for complex video bitstreams.

DISCLOSURE OF THE INVENTION

An advantage of the present invention is in increasing the reliability of a video display system for decoding bitstreams containing encoded video data.

Another advantage of the present invention is in increasing bit rate input of a video display system.

A further advantage of the present invention is in decreasing power dissipation of circuitry implemented in a video display system.

A further advantage of the present invention is in improving error detection and recovery within a video display system.

Still another advantage of the present invention is in decreasing the gate count of circuitry implemented in a video display system.

According to the present invention, the foregoing and other advantages are achieved in part by a variable length decoder comprising a bitstream feeder coupled to a header analyzer, a block data decoder and a control circuit. A bitstream of 64 bits is inputted into the bitstream feeder from a storage device in response to a bit request signal. The bitstream feeder includes a barrel shifter to output a 32-bit bitstream to the header analyzer, block data decoder and control circuit. The header analyzer or the block decoder outputs a size value to the bitstream feeder which indicates the number of bits used from the 32-bit bitstream to decode the parameters contained in the header layers or the video data contained in the macroblock and block layers of MPEG. The bitstream feeder discards the used bits, and outputs a new 32-bit bitstream containing the unused bits and new bits replacing the used bits.

The header analyzer detects the start codes of the MPEG layers and decodes the parameters of the MPEG layers contained in the encoded bitstream. The parameters are outputted on a PARAMD bus line, and the header analyzer also outputs a PARAMA signal indicating the type of parameter being outputted on the PARAMD bus line. Further, the header analyzer decodes the quantization factors of an 8×8 pixel data, which have been converted into 64 DCT coefficients. Once the parameters of the slice layer have been decoded from the bitstream, the header analyzers outputs a signal to enable the block data decoder.

The block data decoder includes a macroblock decoder and a block decoder. The macroblock decoder outputs a header_start signal, and activates the block decoder. The block decoder includes a code table for decoding the encoded 64 coefficients in each of the 6 block layers based on a binary pattern of a predetermined number of bits in the bitstream. All of the 6 block layers are decoded within 384 clock cycles.

The control circuit monitors the function of the bitstream feeder, the header analyzer and the block data decoder. The control circuit initiates the operation of the variable length decoder in response to a start signal. When an error occurs in the header analyzer and the block data decoder, the control circuit determines whether such an error is fatal or non-fatal. If non-fatal, the variable length decoder corrects the error and then continues to decode the bitstream. If fatal, the control circuit is reset, and header analyzer searches for the next valid start code. Further, if the variable length decoder is processing data faster than other external circuits of the chip, the control circuit pauses the decoding operation until the external circuits catch up with the variable length decoder.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF DRAWINGS

The invention will be described in detail with reference to the following drawings in which like reference numerals refer to like elements wherein.

BEST MODE FOR CARRYING OUT THE INVENTION

Figure 4:
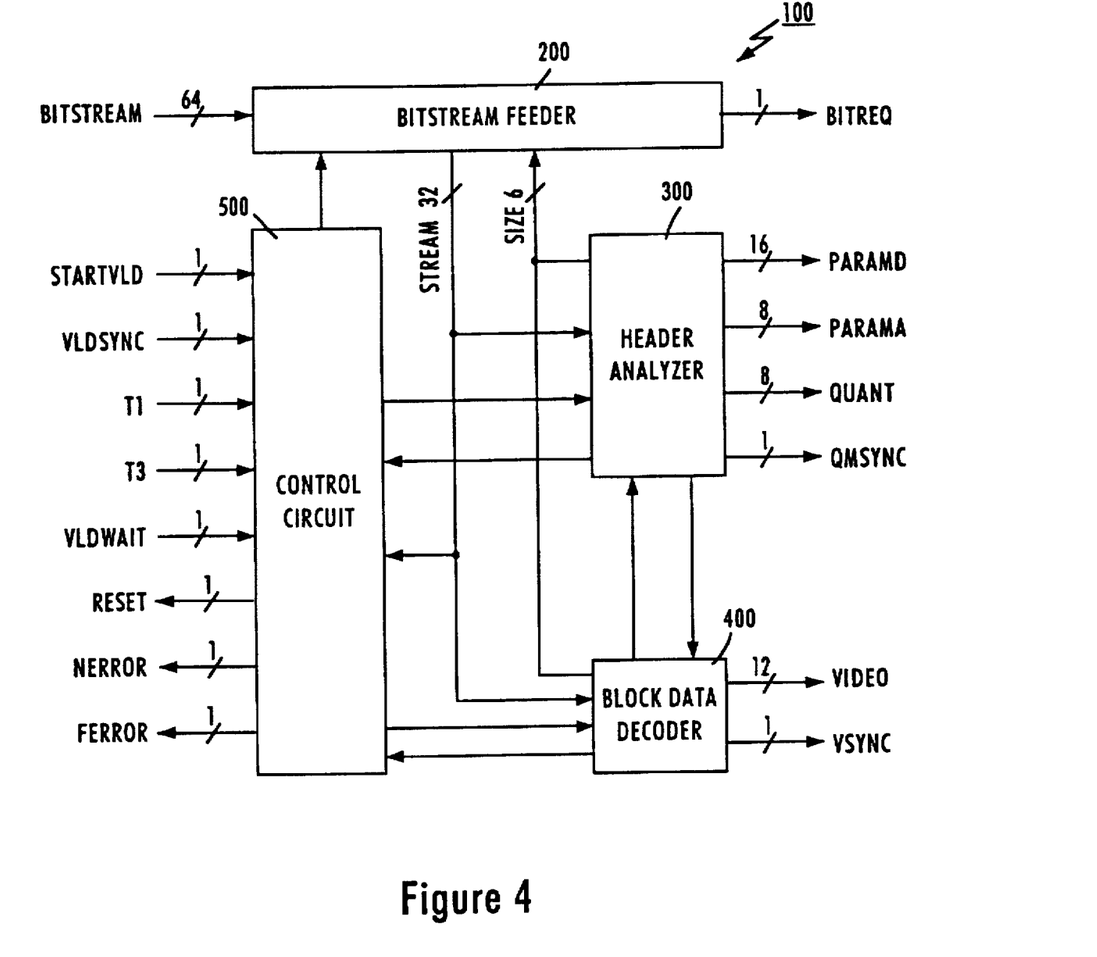
FIG. 4 depicts a VLD in accordance with the present invention.

When encoded bitstreams are received by a television, computer, etc, a microprocessor stores the bitstreams of encode data in a storage device. In order to decode the bitstream containing the Huffman codewords, a VLD sends a request signal to the microprocessor. FIG. 4 is a diagram of a VLD 100 in accordance with the present invention, which comprises a bitstream feeder 200 coupled to a header analyzer 300, a block data decoder 400 and a control circuit 500 connected to one another as shown.

The control circuit 500 controls the operation of the VLD 100 in response to various input control signals. In response to a STARTVLD signal from an external component, the VLD 100 initiates the decoding process and outputs a signal to the bitstream feeder, which outputs a 1-bit BITREQ (bitstream request) signal to the microprocessor to input a 64-bit bitstream from the storage device to the bitstream feeder 200.

The VLD 100 outputs the decoded data to a display device in response to a VLDSYNC (VLD synchronization) signal. T1 and T3 are two clock signals which comprise 2-phase clocking. The 2-phase clocking is used to reduce the probability of racing conditions within the VLD 100. A VLDWAIT (VLD wait) signal momentarily pauses the VLD 100 from proceeding with the decoding operation if the VLD 100 is processing data faster than other circuits. When the other circuits are ready, the external CPU releases the VLD 100 to proceed with the decoding operation.

A RESET signal, when activated, will reset the VLD 100 and terminate the decoding process. The VLD goes back to an initial state of waiting and searching for the sequence layer. A NERROR signal is activated when there is a non-fatal error, and a FERROR signal is activate when there is a fatal error. A non-fatal error does not affect the decoding of other bitstreams. For example, a non-fatal error maybe be an error in the time stamp, which is not necessary for decoding the bitstream. A fatal error may be a picture size of zero since such a picture size does not exist. The control circuit 500, the header analyzer 300 and block data decoder 400 are coupled to one another, so that each detect errors to send to each other the appropriate error signals.

Because the received bits are variable length encoded and the number of bits needed for decoding a parameter and a pixel of data are unknown, the bitstream feeder outputs a 32-bit bitstream of encoded data to the control circuit 500, header analyzer 300 and block data decoder 400. If the header analyzer 300 or the block data decoder 400 utilizes a particular number of bits from the 32-bit bitstream of encoded data, the header analyzer 300 or the block data decoder 400 sends a 6-bit value to the bitstream feeder 200 indicative of the particular number. Thereafter, the bitstream feeder shifts out the used bits starting from the most significant bit, and shifts in new bits in the least significant bits. This new 32-bit bitstream is then outputted to the header analyzer 300 and the block data decoder 400.

For example, the header analyzer 300 decodes the upper 4 bits of the 32-bit bitstream to be the encoded picture size parameter in the sequence layer. The header analyzer 300 sends a value of four on the 6-bit bus line to the bitstream feeder indicating that the upper four most significant bits have been used. In response, the bitstream feeder 200 shifts out the upper four bits, and uses the remaining 28 bits with new 4 lower bits during the next clock cycle.

The bitstream feeder 200 shifts in the 4 new bits from the remaining 64-bit bitstream into the lower four bit position, and outputs another 32-bit bitstream to the control circuit 500, header analyzer 300 and block data decoder 400. This shifting of the encode data bitstream is repeated until all 64 bits have been decoded. Thereafter, the bitstream feeder outputs a 1-bit BITREQ (bit request) signal to the microprocessor to input another 64-bit bitstream to the bitstream feeder.

The header analyzer 300 includes a start code monitoring, searching and detecting circuit. Upon detection of a start code, the header analyzer 300 extracts all display parameters from the encoded bitstream as output PARAMD (parameter data) and PARAMA (parameter address) signals. The values of the PARAMA signal on a 8-bit bus line indicate what type of a parameter is being outputted on the PARAMD bus line.

For example, if the PARAMA signal has a value of zero, the PARAMD data is the horizontal size, which is sent to other circuits of the display device or system. Similarly, if PARAMA signal has a value of one, the parameter or the PARAMD bus line is the vertical size. This arrangement of PARAMA and PARAMD bus lines reduces the interconnection needed between the VLD and other parts of the chip and display device/system. These display parameters are contained in the header and one parameter is decoded per clock cycle.

The header analyzer 300 can also decode and output quantization tables that are contained in the 32-bit encoded bitstream to output a QUANT signal on the 8-bit bus line. The QUANT signal is downloaded to a quantizer block (not shown) to form the quantization table comprising an 8 by 8 table for 64 pixels. A quantization table includes the quantization factors for the compression ratio. The 64 coefficients of picture data in each block is then multiplied by the corresponding factor of the quantization table. The QMSYNC signal outputted on a 1-bit bus line indicates that the header analyzer 300 is outputting the quantization data on the QUANT data bus line.

The header analyzer 300 can also detect any illegal parameter values and notify the control circuit 500 and the block data decoder 400 of the error. For example, if a start code is detected during the decoding of macroblock and block layers by the block data decoder 400, the header analyzer 300 detects such an error, and outputs a corresponding signal to the block data decoder 400 to interrupt the decoding. The header analyzer 300 flags this error to the control circuit 500 which determines whether the error is fatal error or non-fatal error. If non-fatal, the block data decoder 400 reinitiates the decoding. If fatal, the control circuit 500 resets the VLD to search for the next valid start code.

After the header analyzer 300 decodes the bitstream up to the slice layer, the header analyzer 300 outputs an appropriate signal to the block data decoder 400 to indicate that bitstreams containing the enacted data of the macroblock layer are being sent from the bitstream feeder 200. The block data decoder 400 extracts the video data from the encoded bitstream. The video data which is contained in the bitstream is Huffman encoded in variable length. The block data decoder 400 contains a code table which handles these variable length codewords. Each of these code tables are designed from combinational logic such that the operation of the block data decoder is relatively fast. The code table also indicates any illegal or corrupted code words. This detection of corrupted codewords are then used for error concealment.

The block data decoder 400 decodes one Huffman codeword per clock cycle. One macroblock is processed completely every time the block data decoder 400 is enabled. A macroblock contains 6 blocks of video data. A block contains the data representing the 64 coefficients of the picture data. Due to Huffman encoding, less than 64 Huffman codewords may be contained in the bitstream for one block layer. In other words, one Huffman codeword may represent multiple coefficients. The block data decoder 400 will reconstruct all 64 coefficients.

The block data decoder 400 outputs one coefficient per clock cycle as a VIDEO signal on a 12-bit bus line, even if every coefficient in the block has a value of zero. Unless an error is detected, the block data decoder 400 always takes exactly 384 clock cycles to process one macroblock of data, regardless of the actual values of the coefficients. If another start code is detected after the macroblock and block layers are decoded, the block data decoder 400 outputs a signal to the header analyzer 300 indicating that the decoding of the macroblock layer is complete. The block data decoder 400 also outputs a vertical synchronization (VSYNC) signal which is generally used in TVs to indicate the video starts.

Figure 5:
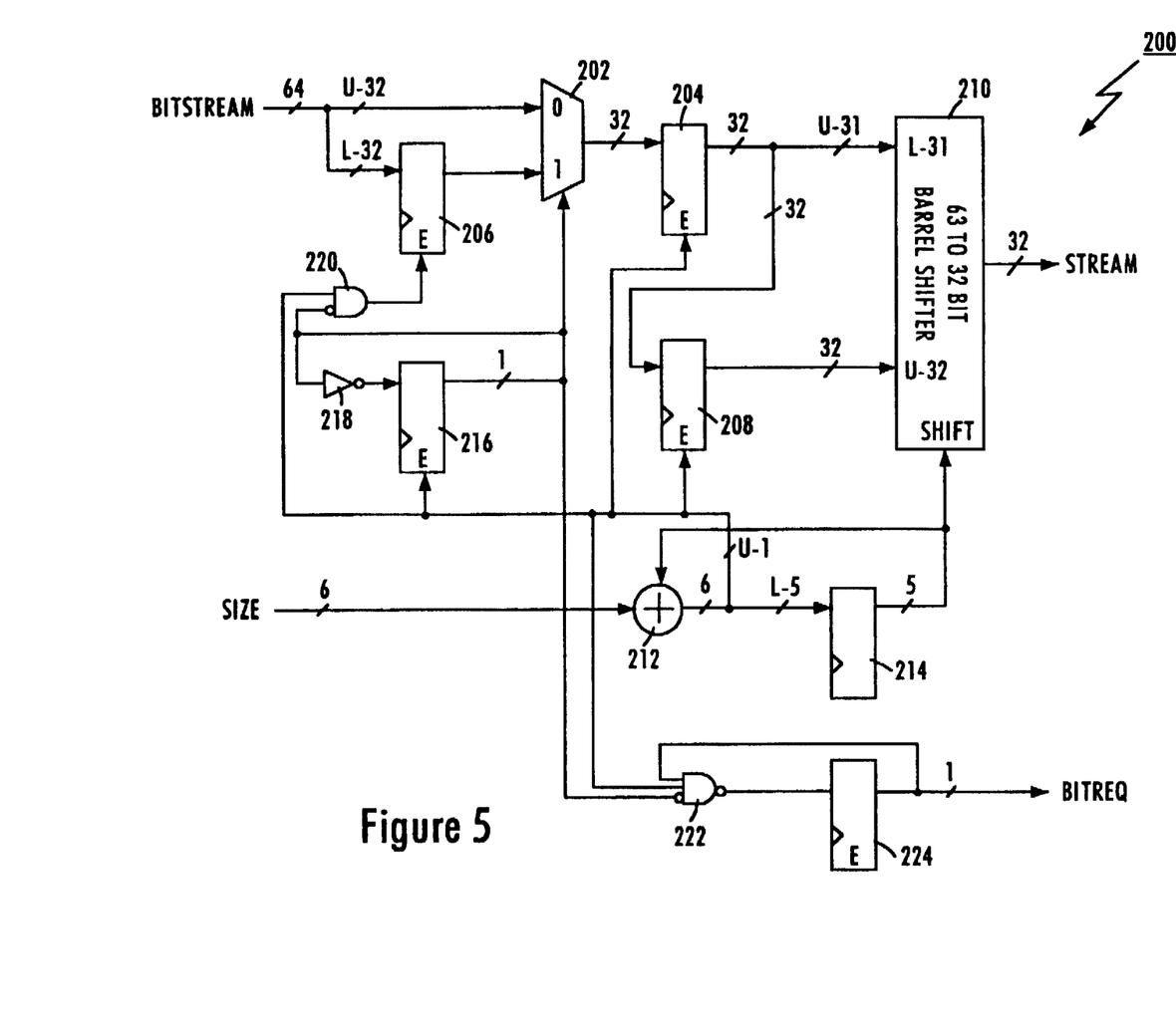
FIG. 5 is a detailed illustration of a bitstream feeder shown in FIG. 4.

FIG. 5 is a detailed illustration of the bitstream feeder 200. In response to a BITREQ signal, the storage device (not shown) inputs a 64-bit encoded bitstream into the bitstream feeder 200. During the initial clock cycle (e.g., clock cycle 1), the upper 32 significant bits, i.e., bits [63:32], are applied to an Input__0 of a selector 202 and stored in a register 204. The lower significant bits, i.e., bits [31:0], are stored in a register 206. During clock cycle 2, the bits [63:32] are outputted from the register 204 and stored into a register 208. Further, the bits [31:0] from the register 206 are applied an Input__1, and stored into the register 204.

Although a total of 64 bits are stored in the registers 204 and 208, the least significant bit [0] is discarded, and 63 bits are inputted to a 63 to 32 bit barrel shifter 210. Depending on a shift value on a 5-bit bus line, the barrel shifter 210 outputs a 32-bitstream containing bits from the register 204 and/or the register 208. If the shift value equals zero, the 32-bit bitstream output is the same as the upper 32 bits, i.e. bits [63:32]. If the shift value equals one, then the 32-bit bitstream output comprises the 31 lower bits [62:32] and one upper bit of bits [31:0], i.e., bits [62:30].

If the shift value equals thirty-two at a clock cycle N, a BITREQ signal is sent out, and a new 64-bit bitstream is inputted to the bitstream feeder 200. The bits [63:32] stored in the register 208 during clock cycle 1 are discarded, and bits [31:0] are shifted into the register 208. The upper significant bits [63:32] of the new bitstream are inputted into the register 204. The lower significant bits [31:0] are stored into the register 206. During this period, the shift value is reset to zero, and the barrel shifter 210 outputs a 32-bit bitstream comprising the bits [31:0] of the register 208.

When the shift value again reaches thirty-two at a clock cycle N+i, the bits [31:0] stored in the register 208 are discarded. The bits [63:32] of clock cycle N are shifted into the register 208. The bits [31:0] stored in the register 206 during the clock cycle N are applied to the Input__1 of the selector 202 to be stored in the register 204. The shift value is reset to zero, and bits [63:32] stored in the register 208 is outputted by the barrel shifter 210. A new 64-bit bitstream is applied to the bitstream feeder 200 when the shift value again reaches thirty-two, and the above process is repeated.

The rest of the circuitry of the bitstream feeder 200 is used to control the above shifting of the 64-bit bitstream. An adder 212 and a register 214 keep track of the shift value. A size value on a 6-bit bus line is inputted from either the header analyzer 300 or the block data decoder 400. The size value indicates the number of upper bits of the 32-bit bitstream from the barrel shifter which has been used by either the header analyzer 300 or the block data decoder 400 to decode a particular parameter or video data. The adder 212 adds this shift value with the previous size value stored in the register 214. The summed value is stored in the register 214, and is used as the shift value for the barrel shifter 210 to output a new 32-bit bitstream from the 64 bit data stored in the registers 204 and 208.

Although the output of the adder 212 is 6 bits, only 5 lower bits are applied to the register. Since 5 bits can only represent a value up to thirty-one, the register 214 automatically rolls over to zero, i.e., resets the shift value to zero, when the shift value reaches thirty-two. The upper 1-bit is used to enable the registers 204 and 208 to shift in the new data once the shift value reaches thirty-two. The upper 1-bit also enables a register 216 to output a signal to control the selection of the selector 202. The output of the register 216 also is inverted by an inverter 218, and stored in the register 216.

The upper 1-bit and the output of the register 216 is logically ANDed by the AND gate 220 to output a signal to control the shifting of the new data into the register 206. Further, these signals are applied as inputs to an AND gate 222. Until the shift value reaches thirty-two, the BITREQ signal does not activate the storage device to shift in a new 64-bit bitstream. As shown, the BITREQ signal is a result of logically ANDing the upper 1 bit, the output of the register 216 and the previous BITREQ signal, which are stored in a register 224. Once the shift value reaches thirty-two, the BITREQ signal activates the storage device to shift in the new 64-bit bitstream of encoded data.

Figure 6A:
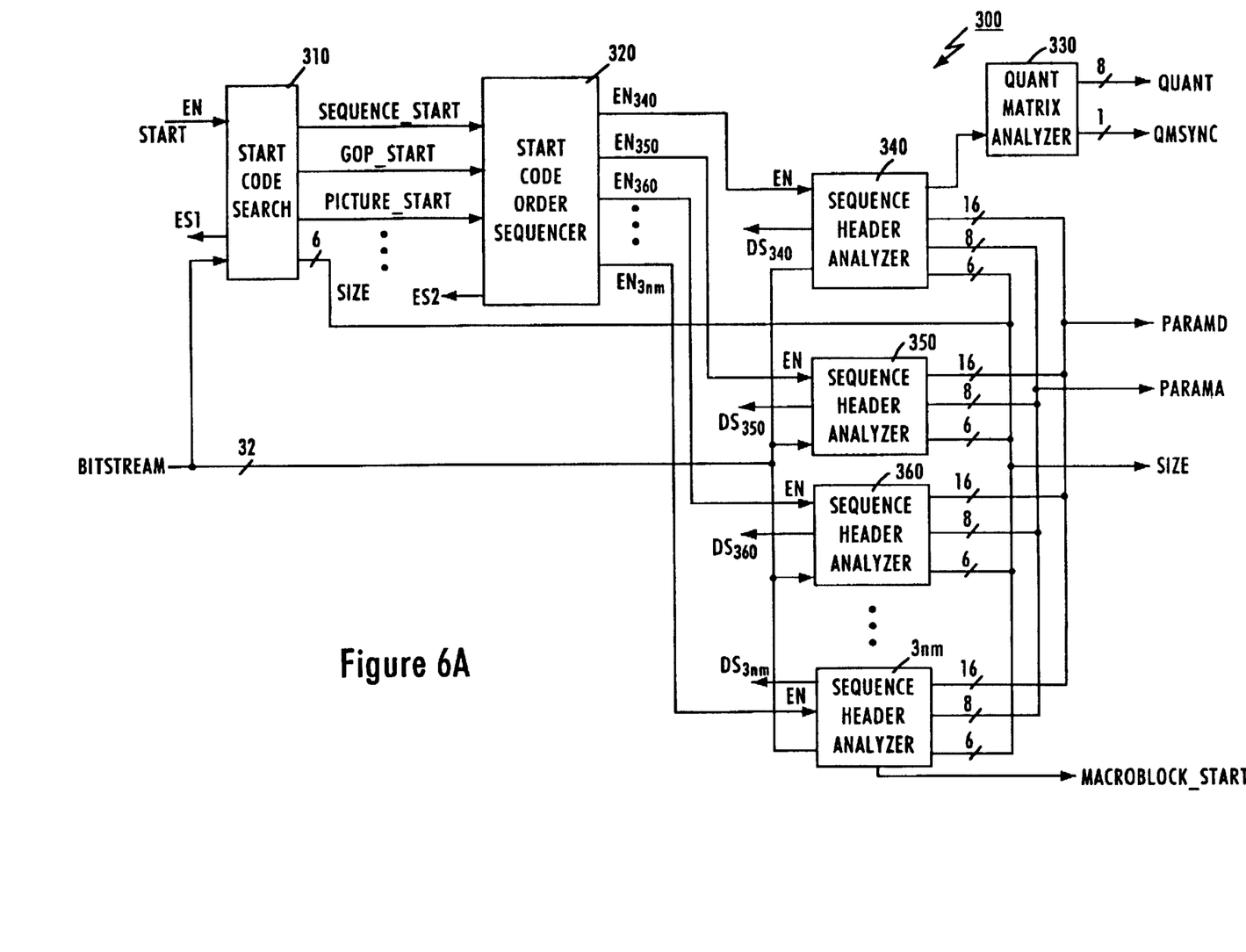
FIG. 6A is a detailed illustration of a header analyzer shown in FIG. 4.
Figure 6B:
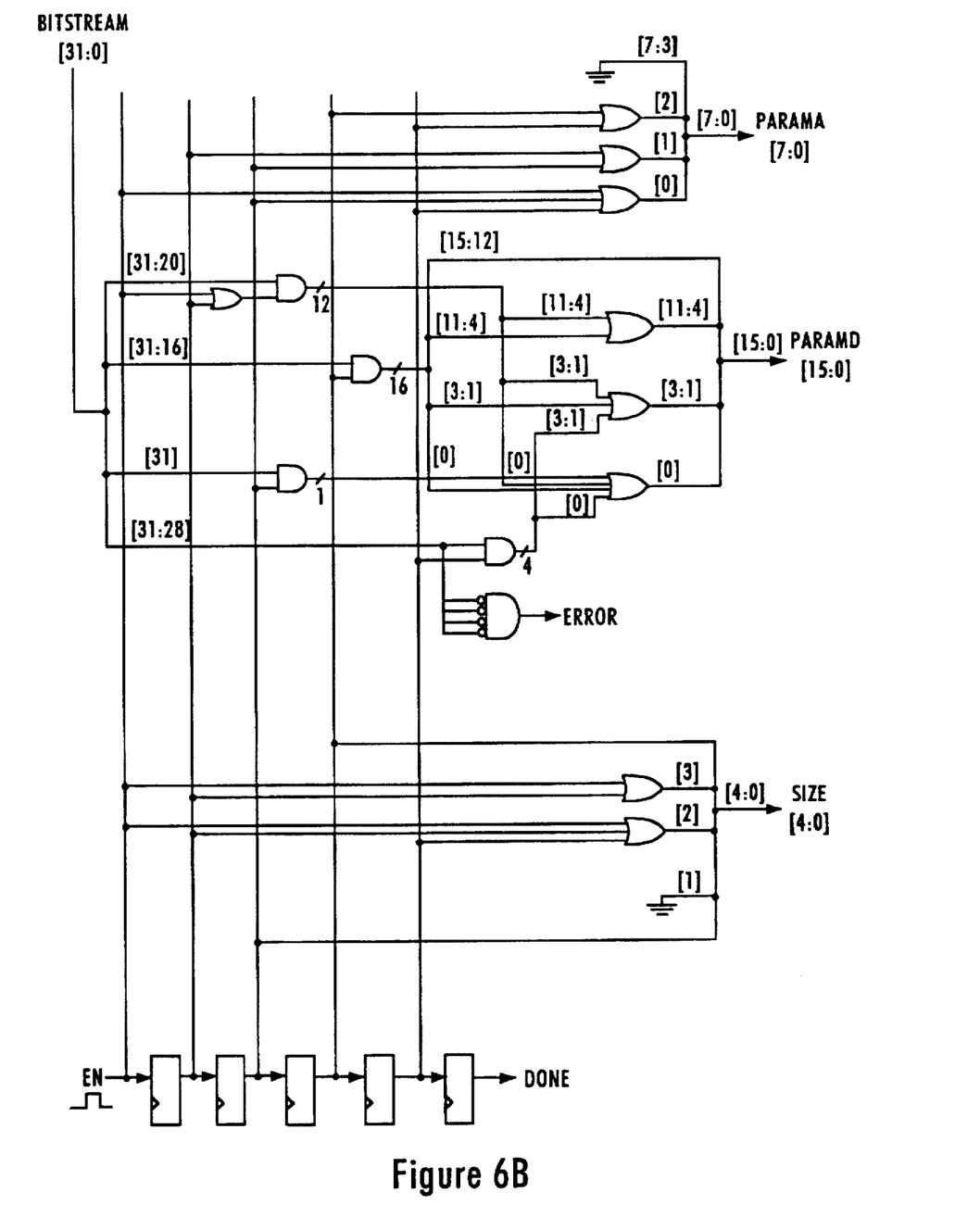
FIG. 6B is a sample illustration of an analyzer of FIG. 6A.

FIG. 6A is a detailed illustration of the header analyzer 300 shown in FIG. 4. The header analyzer 300 comprises a start code searching circuit 310 connected to a start code order sequencer 320, which controls a plurality of analyzers 330, 340, 350, 360 . . . 3nm. Further, FIG. 6B is a sample illustration of an analyzer 3nm illustrated in FIG. 6A since all the analyzers have similar circuit construction.

The start code searching circuit 310 searches and detects the start codes in response to an enable signal EN1 from the control circuit 500. An example of such a circuit can be found in a commonly assigned co-pending U.S. patent application Ser. No. 08/561,756 filed on Nov. 22, 1995 entitled "High Bit Rate Start Code Searching and Detecting Circuit," which is incorporated herein by reference. The circuit 310 receives the 32-bit bitstream from the bitstream feeder 200 to determine whether start codes of the sequence, group of pictures, picture, etc, layers are detected, and outputs the appropriate Sequence__Start, GOP__Start, Picture__Start, etc, signals. Further, the circuit 310 output a 6-bit size value indicating how may bits of the 32-bit bitstream were used to detect a start code. The size value is applied to the bitstream feeder 200 to shift out the used bits, and a new 32-bit bitstream is inputted into the header analyzer 300, block data decoder 400 and control circuit 500. If an error is detected, the circuit 310 outputs an error signal ES to the control circuit 500.

As described above, the header layers, i.e., sequence, group of picture, picture, etc, of the MPEG standard are organized in a particular sequence. The start code order sequencer 320 monitors the detection of the start codes to determine whether start code signals generated by the start code circuit 310 are being detected in the appropriate sequence. For example, if the sequencer 320 detects the picture start code prior to the group of picture start code, the sequencer 320 outputs an error signal EN2 to the control circuit 500. If the appropriate start code is detected, the sequencer 320 generates a corresponding enable signal $EN_{3nm}$ to activate the corresponding one of the plurality of header analyzers $3nm$.

Once enabled, the corresponding analyzer $300nm$ decodes the 32-bit bitstream to output the parameters, i.e., PARAMD signals, of header layers. The PARAMA signal generated by the analyzer $3nm$ indicate what type of parameter is outputted on the PARAMD bus line. The size value indicates the number of bits decoded from the 32-bit bitstream to decode the parameter on the PARAMD bus line. After complete decoding the parameters of a header layer contained in the encoded bitstream, the corresponding analyzer 340 outputs a done signal $DS_{3nm}$ to the sequencer 320.

For example, when the start code circuit 310 outputs a Sequence_Start signal, the sequencer 320 outputs an enable signal $EN_{340}$ to activate the sequence header analyzer 340, assuming the sequence start code is detect in a proper sequence. Once enabled, the analyzer 340 decodes the 32-bit bitstream to output a horizontal size parameter on the PARAMD bus line, and the PARAMA signal indicates that the horizontal size parameter is being outputted on the PARAMD bus line. The analyzer 340 outputs a size value to receive a new 32-bit bitstream from the bitstream feeder 200. The sequence header analyzer 340 then decodes and outputs the vertical size parameter on PARAMD bus line. The above process is repeated to decode the aspect ratio information parameter, frame rate parameter, etc, until all the parameters of the sequence layer contained in the encoded bitstream is decoded.

After completion, the sequence header analyzer 340 outputs a done signal $DS_{340}$ to the sequencer 320. However, if the sequencer 320 receives a start code (e.g., a GOP_start signal) prior to completion, the sequencer 320 flags an error signal to the control circuit. Otherwise, the sequencer 320 awaits for the detection of the group of picture start code by the start code circuit 310 to enable the GOP header analyzer 350.

Since the quantization factors are also contained in the sequence layer, the enablement of the sequence layer activates the quantizer matrix analyzer 330. During the decoding of the parameters in the sequence layer, the quantizer matrix decoder decodes the quantization factors contained in the encoded bitstreams to output the QUANT and the QMSYNC signals. As can be appreciated, the quantizer matrix analyzer 330 can be discrete by itself or be a subset of the sequence header analyzer 340.

With the appropriate sequential detection of the start codes, each of the analyzers are activated to decode all the parameters within the encoded header layers. Once the parameters of the slice layer has been decoded from the encoded bitstream, the slice header analyzer $3nm$ outputs a Macroblock_Start signal to indicate to the block data decoder 400 that the incoming bitstream contains the encoded video data of the macroblock and block layers. In response, the block data decoder 400 decodes the bitstream to output the VIDEO signal containing the pixel data for the display system.

Figure 7A:
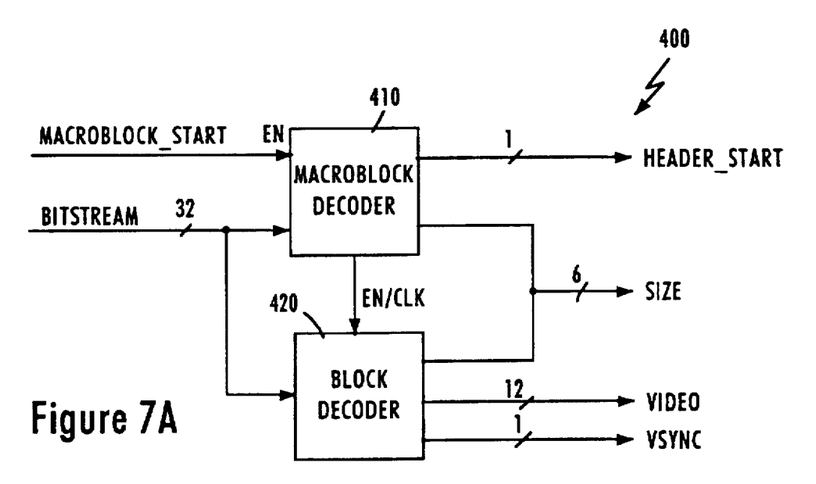
FIG. 7A is a detailed illustration of a block data decoder of FIG. 4.

FIG. 7A is a detailed illustration of the block data decoder 400 of FIG. 4. The block data decoder 400 comprises a macroblock decoder 410 connected to a block decoder 420. In response to the Macroblock_Start signal from the slice header analyzer $3nm$, the macroblock layer decodes the 32-bit bitstream to generate a Header_Start signal, and outputs a size value indicative of the number of bits used from the bitstream to decode the Header_Start signal. Once the Header_Start signal has been decoded, the macroblock decoder 410 outputs 364 enable/clock signals EN/CLK to the block decoder 420 to decode the encoded 64 quantized DCT coefficients contained in each of the 6 block layers.

Figure 7B:
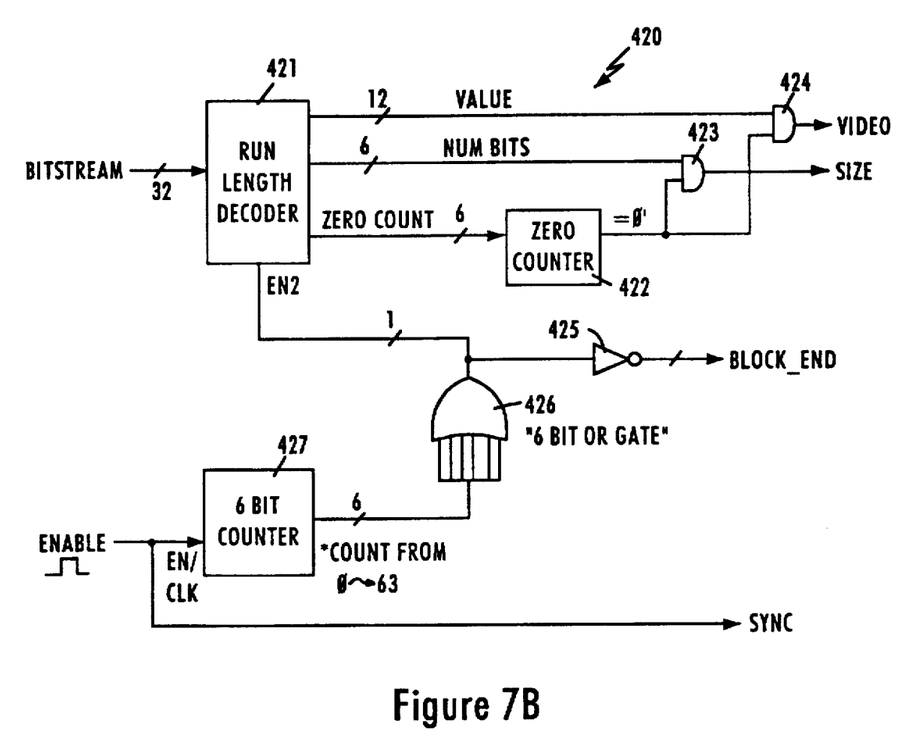
FIG. 7B is an illustration of a block decoder shown in FIG. 7A.

FIG. 7B is an illustration of the block decoder 420, which comprises a run length decoder 421, a zero counter 422, AND gates 423 and 424, an inverter 425, an OR gate 426 and a 6-bit counter 427. As discussed above, each macroblock layer contains 6 blocks of 64 DCT coefficients. To decode each coefficient during each clock cycle, the 6-bit counter increments a count value each time an enable/clock signal EN/CLK is applied, and the EN/CLK signal is also outputted as the VSYNC signal. The count value is applied to a 6-bit OR gate 426 to enable the run length decoder 421. When the count value reaches a value of sixty-three, an end of the block signal (Block_end) signal of an appropriate potential is generated by the inverter 425 to indicate that the 64 coefficients of a block has been decoded. The above is repeated for the 6 block of data of the macroblock layer.

Figure 7C:
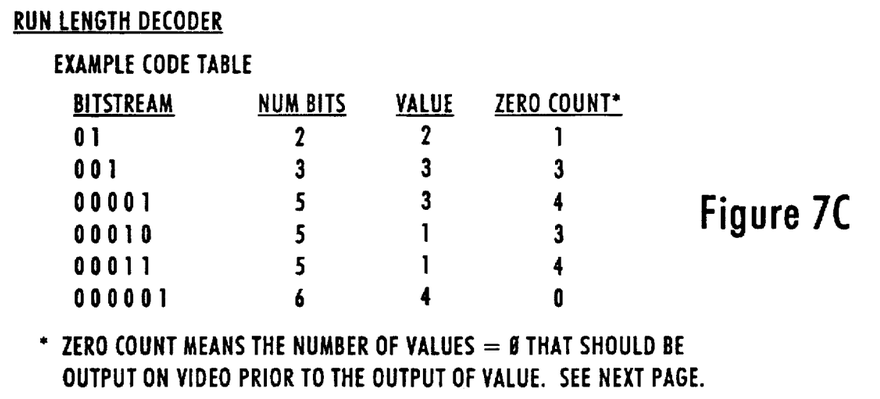
FIG. 7C is an example of the code table contained in a run length decoder of FIG. 7B.

The run length decoder 421 includes a code table to generate 12-bit Value, 6-bit NumBits and 6-bit ZeroCount signals based the binary pattern of a predetermined number of the 32-bit bitstream. An example of the code table is illustrated in FIG. 7C. The ZeroCount signal applied to a zero counter 422 generates a number of zeros which should precede the Value signal. In other words, the ZeroCount signal indicates the number of zeros that should be outputted as a VIDEO signal prior to the output of the Value signal on the VIDEO bus line.

Figure 7D:
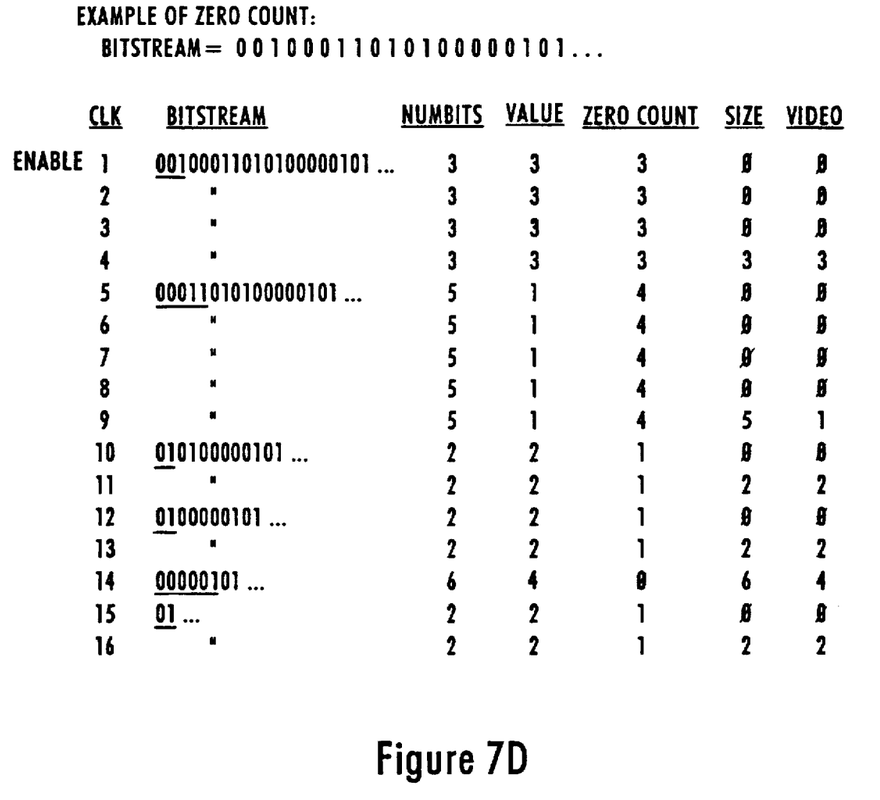
FIG. 7D shows an operation of the block decoder when a bitstream "0010010001101010000101 . . . " is decoded.

FIG. 7D is an illustration of the operation of the block decoder 4.20 when a bitstream "001000110101000000101 ..." is decoded. During clock cycle 1, the first 3 bits "001" are matched with the binary pattern of bitstream in the code table to generate the NumBits, Value and ZeroCount signals. As shown in the code table of FIG. 7C, three zeros should be outputted as a VIDEO signal prior to the Value signal being outputted. Hence, during clock cycles 1-3, the value of zero is outputted on the VIDEO bus line, and the size value remains zero, i.e., the same 3-bits are used for the three clock cycles. After the three 0s has been generated, the Value signal of three is outputted on the VIDEO bus line, and a size value of three is applied to the bitstream feeder 200.

In response to the size value of three, the used bits "001" are discarded, and the remaining bits with a new 3 lower bits are applied to the header analyzer 300 and block data decoder 400. The run length decoder 421 matches the upper 5 bits "00011" with a binary pattern in the code table. As shown, the value of the NumBits, Value and ZeroCount signals are five, one and four, respectively. Hence, four 0s are outputted as a VIDEO signal during clock cycles 5–8 prior to the Value signal of one being outputted at clock cycle 9. A size value of five is applied to the bitstream feeder 200 to indicate the number of bits used. The above process is repeated for 64 clock cycles to decode 64 coefficients from the encoded bitstream, and is done for each of the 6 block layers. Hence, the 364 coefficients of all 6 block layers are decoded during the 364 clock cycles.

This MPEG video VLD has many advantages over existing designs. First, this VLD incorporates only one barrel shifter and combinational code tables, which allows for a very fast decoding time and small area requirements. Further, the VLD can detect out of order layers in the bitstream. The VLD will then determine which layer or layers will be valid to restart decoding after a misplaced layer has been detected.

The VLD of the present invention can also process any MPEG encoded video bitstream, even if the bitstream contains errors. If an error is detected in the bitstream, the VLD will correct the error, if possible. If the error is non-correctable, the VLD will determine if the error is a fatal error or ignored as a non-fatal error. If the error is a non-fatal error, the VLD will continue with normal decoding. If a fatal error is detected, the VLD can recover from this error and search for the next valid start code without any external control. Such a method of detecting errors allows for easy error detection and concealment.

All MPEG layers can be decoded, including any extension data, user data and quantization tables. One parameter is decoded per clock and immediately outputted while processing the bitstream header information for each layer. After the parameter extraction, the VLD has a set number of 384 clock cycles for decoding one macroblock of the video data, which allows for easy synchronization with the remainder of the MPEG decoding system.

The foregoing embodiment is merely exemplary and not to be construed as limited to the MPEG encoded bitstreams. The present invention can be applied to many different decoding systems requiring the decoding of bitstreams containing encoded video data. Many alternatives, modifications and variations will be apparent to those skilled in the art.

What is claimed is:

1. A device for decoding an encoded bitstream containing parameter data and video data, comprising:

a bitstream feeder for feeding an encoded bitstream;

a first decoder receiving the encoded bitstream and decoding the encoded bitstream to extract the parameter data; and a second decoder receiving the encoded bitstream and decoding the encoded bitstream to extract the video data, wherein at least one of said first and second decoders provides a signal to said bitstream feeder to cause said feeder to discard a prescribed number of bits from the encoded bitstream, based on the parameter data.

2. The device of claim 1 further comprising means for controlling and monitoring functions of said bitstream feeder, and first and second decoders.

3. The device of claim 1, wherein the signal is representative of a prescribed number of bits used in the bitstream to decode one of the parameter data and video data.

4. The device of claim 3, wherein said bitstream feeder comprises:

a first register to store a first predetermined number of bits;

a second register to store a second predetermined number of bits; and a barrel shifter, coupled to said first and second registers, outputting the encoded bitstream comprising portions of said first and second predetermined number of bits based on said prescribed number.

5. The device of claim 4, wherein said bitstream feeder further comprises:

an adder to add the prescribed number with a prescribed number of a previous cycle; and a third register to store a sum of the addition, the sum being used as the prescribed number during a next cycle.

6. The device of claim 4, wherein said bitstream feeder further comprises means for discarding at least one of the first predetermined number of bits stored in the first register and the second predetermined number of bits stored in the second register when said prescribed number equals a preset value.

7. The device of claim 6, wherein said bitstream feeder further comprises means for generating a signal to request new bits for said first and second registers when said prescribed number equals a preset value.

8. The device of claim 1, wherein said first decoder comprises:

means for searching for a start code within the encoded bitstream, and outputting a start code signal upon detection;

means for determining whether the start code is detected in a preset sequence; and means, responsive to the determining means, for decoding the encoded bits to extract the parameter data.

9. The device of claim 8, wherein said first decoder comprises a plurality of header analyzers, each header analyzer being activated by a corresponding signal from said sequence determining means, and outputting parameter data decoded from the encoded bitstream on a first bus, outputting a signal on a second bus indicating a parameter type on the first bus, and outputting the prescribed number indicating a number of bits used from the encoded bitstream to decode a parameter of the parameter data per clock cycle.

10. The device of claim 9, wherein said first decoder further comprises a quantizer matrix analyzer to decode from the encoded bitstream quantization factors used to compress the encoded bitstream.

11. The device of claim 1, wherein said second decoder comprises:

a first means for decoding from the encoded bitstream a header start parameter and outputting the prescribed number indicating the number of bits used during decoding; and a second means for decoding from the encoded bitstream the video data.

12. The device of claim 11, wherein said second means decodes one video coefficient per clock cycle.

13. The device of claim 11, wherein said second means comprises:

a run length decoder including combinatorial logic circuitry based on a code table to recognize a binary pattern of the encoded bitstream, and outputting a preset number of binary zero prior to a value of the video data on a third bus line;

a counter maintaining a count value indicative of a number of video coefficients decoded, and enabling said run length decoder until the count value reaches a preset number; and means for determining the prescribed number of bits used from the encoded bitstream to decode one coefficient per clock cycle.

14. A bitstream feeder receiving an N-bit encoded bitstream from a storage device to provide an M-bit bitstream to a device which decodes the M-bit bitstream for parameter data and video data, where N>M, comprising:

first means for storing a first predetermined number of bits of the N-bit bitstream;

second means for storing a second predetermined number of bits of the N-bit bitstream; and a barrel shifter, coupled to said first and second means, outputting the M-bit bitstream comprising portions of said first and second predetermined number of bits based on a prescribed number.

15. The bitstream feeder of claim 14 further comprising:

an adder to add said prescribed number with a prescribed number for a previous cycle; and a third register to store a sum of the addition, the sum being used as the prescribed number during a next cycle.

16. The bitstream feeder of claim 14 further comprising means for discarding at least one of the first predetermined number of bits stored in the first means and the second predetermined number of bits stored in the second means when said prescribed number equals a preset value.

17. The bitstream feeder of 16 further comprising means for generating a signal to request new bits for at least one of said first and second means when said prescribed number equals the preset value.

18. A device for a variable length decoder used to decode an encoded bitstream for parameter data of header layers in the MPEG standard, comprising:

means for searching a valid start code within the encoded bitstream, and outputting a start code signal upon detection;

means for determining whether the start code is detected in a preset sequence; and means, responsive to said sequence determining means, for decoding the encoded bitstream to extract the parameter data.

19. The device of claim 18, wherein said decoding means comprises a plurality of header analyzers, each header analyzer being activated by a corresponding signal of said sequence determining means, and outputting the parameter data decoded from the encoded bitstream on a first bus, outputting a signal on a second bus indicating a parameter type on the first bus, and outputting the prescribed number indicating a number of bits used from the encoded bitstream to decode a parameter of the parameter data per clock cycle.

20. The device of claim 19, wherein said decoding means further comprises a quantizer matrix analyzer to decode from the encoded bitstream quantization factors used to compress the encoded bitstream.

21. A device for a variable length decoder used to decode an encoded bitstream for video coefficients of macroblock and block layers in the MPEG standard, comprising:

a first decoder for decoding from the encoded bitstream a header start parameter; and a second decoder for decoding from the encoded bitstream one video coefficient per clock cycle.

22. The device of claim 21, wherein said second decoder comprises:

a run length decoder including combinatorial logic circuitry based on a code table to recognize a binary pattern of said encoded bitstream, and outputting a preset number of binary zero prior to a value of the video coefficient on a third bus line; and a counter maintaining a count value indicative of a number of video coefficients decoded, and enabling said run length decoder until the count value reaches a preset number.

23. A method for decoding an encoded bitstream containing parameter data and video data, comprising:

a) outputting the encoded bitstream;

b) decoding the encoded bitstream to extract the parameter data;

c) decoding the encoded bitstream to extract the video data; and d) outputting a prescribed number which is used to discard a prescribed number of bits from the encoded bitstream.

24. The method of claim 23, wherein the prescribed number is indicative of a number of bits used in the bitstream to decode one of the parameter data and video data.

25. The method of claim 23, wherein step (a) comprises:

storing a first predetermined number of bits;

storing a second predetermined number of bits; and outputting the encoded bitstream comprising portions of said first and second predetermined number of bits based on said prescribed number.

26. The method of claim 25, wherein step (a) further comprises:

adding the prescribed number with a prescribed number of a previous cycle; and storing a sum of the addition, the sum being used as the prescribed number during a next cycle.

27. The method of claim 24, wherein said step (a) further comprises:

discarding at least one of the first predetermined number of bits and the second predetermined number of bits when said prescribed number equals a preset value.

28. The method of claim 27, wherein step (a) further comprises generating a signal to request new bits when said prescribed number equals a preset value.

29. The method of claim 23, wherein step (b) comprises:

searching for a start code within the encoded bitstream, and outputting a start code signal upon detection;

determining whether the start code is detected in a preset sequence; and decoding the encoded bits to extract the parameter data.

30. The method of claim 29, wherein step (b) further comprises decoding from the encoded bitstream quantization factors used to compress the encoded bitstream.

31. The method of claim 23, wherein step (c) comprises:

decoding from the encoded bitstream a header start parameter and outputting the prescribed number indicating the number of bits used during decoding; and decoding from the encoded bitstream the video data.

32. The method of claim 31, wherein step (c) decodes one video coefficient per clock cycle.

33. The method of claim 31, wherein step (c) further comprises:

recognizing a binary pattern of the encoded bitstream, and outputting a preset number of binary zero prior to a value of the video data;

maintaining a count value indicative of a number of video coefficients decoded; and determining the prescribed number of bits used from the encoded bitstream to decode one coefficient per clock cycle.

* * * * *